United States Patent

Moughanni et al.

[11] Patent Number: 5,629,643
[45] Date of Patent: May 13, 1997

[54] FEEDBACK LATCH AND METHOD THEREFOR

[75] Inventors: Claude Moughanni; Jeffrey E. Maguire, both of Austin, Tex.

[73] Assignee: Motorola, Inc., Schaumburg, Ill.

[21] Appl. No.: 632,181

[22] Filed: Apr. 15, 1996

Related U.S. Application Data

[63] Continuation of Ser. No. 343,003, Nov. 21, 1994, abandoned.

[51] Int. Cl.$^6$ .................................................. H03K 3/356
[52] U.S. Cl. ........................... 327/199; 327/200; 327/208
[58] Field of Search ........................... 327/200, 199, 327/201, 202, 203, 208, 210, 211, 212, 213, 214, 215, 218

[56] References Cited

U.S. PATENT DOCUMENTS

| | | | |
|---|---|---|---|
| 4,495,628 | 1/1985 | Zasio | 327/202 |
| 4,495,629 | 1/1985 | Zasio et al. | 327/202 |
| 4,569,067 | 2/1986 | Gallup | 327/203 |
| 4,794,276 | 12/1988 | Sasada et al. | 327/202 |
| 4,970,407 | 11/1990 | Patchen | 327/218 |
| 5,170,074 | 12/1992 | Aoki | 327/203 |
| 5,264,738 | 11/1993 | Veendrick et al. | 327/203 |
| 5,321,399 | 6/1994 | Notani et al. | 377/81 |
| 5,463,340 | 10/1995 | Takabatake et al. | 327/201 |

FOREIGN PATENT DOCUMENTS

| | | | |
|---|---|---|---|
| 3443788 | 6/1986 | Denmark | 327/203 |
| 5110391 | 4/1993 | Japan | 327/218 |
| 6188695 | 7/1994 | Japan | 327/202 |

OTHER PUBLICATIONS

Neil H. E. Weste and Kamran Eshraghian, "Principles of CMOS VLSI Design: A Systems Perspective," Second Edition, 1993, pp. 19–21.

Primary Examiner—Timothy P. Callahan
Assistant Examiner—Eunja Shin

[57] ABSTRACT

A latch (40) has a clocked feedback path (46) which performs a static latching function while using less power. The latch includes a feedback device (46) which is selectively decoupled from a feed-forward portion (42, 44) of the latch. In a normal mode of operation when the latch will be clocked often, the feedback device of the latch is not enabled and the latch effectively functions as a dynamic latch. When the latch becomes inactive for an extended period of time, the feedback device is again enabled and the latch is able to store a data value indefinitely.

15 Claims, 2 Drawing Sheets

FEEDBACK LATCH AND METHOD THEREFOR

This application is a continuation of prior patent application Ser. No. 08/343,003 filed Nov. 21, 1994, now abandoned.

FIELD OF THE INVENTION

This invention relates generally to a feedback latch, and more particularly to feedback latch for use in a low power data processor.

BACKGROUND OF THE INVENTION

Latches are commonly used to store data in data processing applications. Some latches perform a static latching function, while other latches perform a dynamic latching function. A dynamic latch typically requires less logic circuitry and less time to latch data values than a static latch. Furthermore, because the dynamic latch requires less circuitry than its static counterpart, the dynamic latch also requires less power, less clock loading, and lower internal capacitance. While the dynamic latch provides significant power savings and requires less circuitry than a static latching function, the charge stored in the dynamic latch may dissipate through leakage and the state of the dynamic latch may change after a period of time. An example of a dynamic latch is illustrated in FIG. 1.

In contrast, a state of a value stored in a static latch does not change after a period of time. Static latches typically provide an active feedback path between an output of the latch and an input of the latch that compensates for leakage currents and prevents a state of the latch from changing. The feedback path may be either a constant feedback path or a docked feedback path. An example of a static latch having a constant feedback path is illustrated in FIG. 2. An example of a static feedback latch having a clocked feedback path is illustrated in FIG. 3.

Circuit area and power differences between the two types of static latches are parameters which a designer of a data processing system must evaluate to determine which type of static latch is better suited to a current design. A static latch having a clocked feedback path may be preferred over static latches having a constant feedback path because it provides a faster latch with no contention on internal nodes of the latch. A static latch which has a constant feedback path may consume more power than a clocked feedback latch because of contention on internal nodes of the constant feedback latch when a new value is stored in the latch. The power consumption of the constant feedback latch may be reduced by reducing the size of a the weak feedback device (usually a weak inverter) such the feedback device is just able to store a data value with no leakage and with no unintentional modification of the data value. However, the feedback device is usually weakened by increasing a length of the transistors forming the feedback device. This increased length results in the consumption of more circuit area and may result in increased loading on the internal nodes of the constant feedback latch.

In contrast, a clocked feedback latch performs its feedback function using a feedback device which is not constantly enabled, but which performs its feedback function using an opposite clock phase than that used for the feedforward function. For example, refer to FIG. 3. In FIG. 3, the feedback transistor (16) provides the "out" signal to the input of a latch 14 when the Clock signal is negated. While the clocked feedback latch has less contention than a constant feedback latch, it does require two additional devices two additional transistors to decouple the feedback path while a new value is loaded into the latch. The two additional devices result in increased circuit area and increased power due to the increased loading on the lines providing the Clock signal. Therefore, the merits of the clocked feedback latch over the constant feedback latch must balance the power and area consumed by the weak feedback devices of the constant feedback latches and the power and area consumed by the feedback gating devices of the clocked feedback latch.

Neither the dynamic latch or static latch implementations described herein provide an effective low power implementation of a latch function which may store a data value indefinitely. Each implementation described above has advantages and disadvantages which must be weighed by a designer to determine the implementation that may be implemented with the least adverse effect on the overall data processing system.

SUMMARY OF THE INVENTION

The previously mentioned needs are fulfilled with the present invention. Accordingly, there is provided, in a first form, a latch. The latch includes a first inverter having a first input for receiving a first clock signal, a second input for receiving a second clock signal, and a third input for receiving an input signal. The first inverter has an output for selectively providing an inverted input signal when the first clock signal is in a first logic state and the second clock signal is in a second logic state. A second inverter has an input connected to the output of the first inverter for receiving the inverted input signal. The second inverter has an output for providing an output signal. A third inverter has a first input for receiving a third clock signal, a second input for receiving a fourth clock signal, and a third input connected to the output of the second inverter for receiving the output signal. The third inverter selectively provides an inverted output signal to the input of the second inverter when the third clock signal is in a third logic state and the fourth clock signal is in a fourth logic state.

In a second form, the present invention provides a method for performing a feedback operation. The method includes the steps of asserting a first dock signal; asserting a second clock signal; and asserting an input signal. The input signal is selectively inverted to provide an inverted input signal using a first inverter when the first clock signal is in a first logic state and the second clock signal is in a second logic state. The inverted input signal is inverted to provide an output signal using a second inverter. As well, the method includes the steps of asserting a third clock signal and asserting a fourth clock signal. The output signal is selectively inverted to provide an inverted output signal using a third inverter when the third clock signal is in a third logic state and the fourth clock signal is in a fourth logic state. The inverted output signal is provided to an input of the second inverter.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

Figure 1:
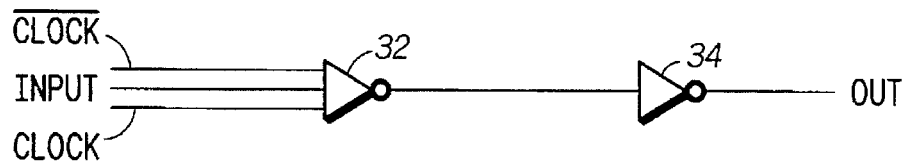
FIG. 1 illustrates in block diagram form a prior art dynamic latch.
Figure 2:
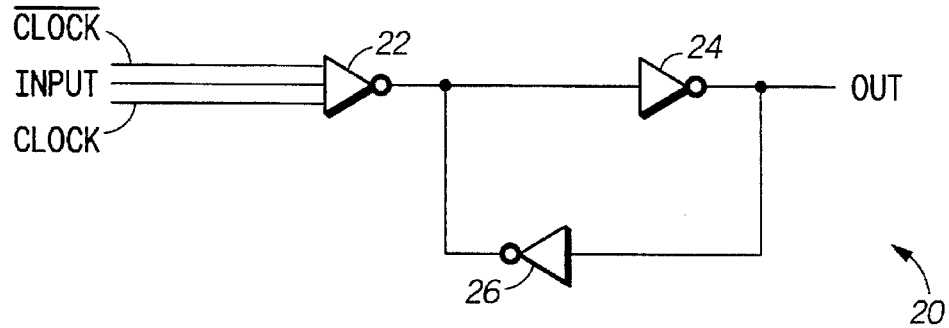
FIG. 2 illustrates in block diagram form a prior art static latch having a constant feedback path.
Figure 3:
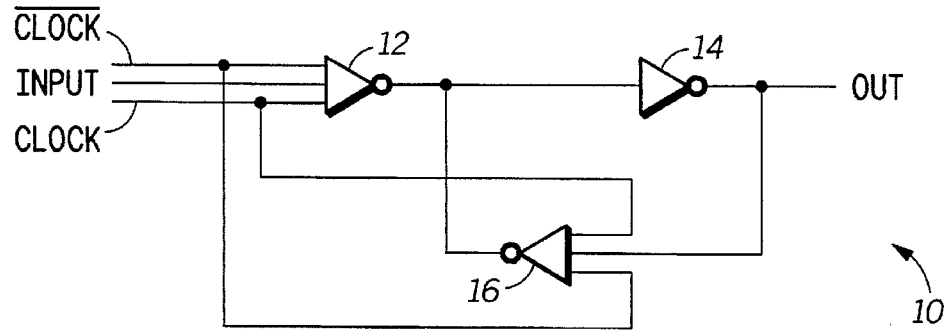
FIG. 3 illustrates in block diagram form a prior art static latch having a clocked feedback path.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

The present invention provides a latch having a clocked feedback path which performs a static latching function while using less power. In the present invention, a feedback device is selectively decoupled from a feed-forward portion of the latch. In a normal mode of operation when the latch will be clocked often, the feedback devices of the latch are not enabled and the latch effectively functions as a dynamic latch. When the latch becomes inactive for an extended period of time, the feedback devices are again enabled and the latch is able to store a data value indefinitely. The extended period of time is defined as the time during which you will lose a dynamic latch state.

By recognizing that the feedback devices are not needed and may be decoupled during periods in which latch is clocked often to prevent a loss of state due to leakage, less power is consumed because there is less clock switching activity than required by prior art implementations of clocked feedback static latches. Furthermore, because the feedback device is decoupled, there is less loading on clock signals and less power is consumed. In fact, the present embodiment of the invention provides a latch which approximates the power consumption of the dynamic latch during normal operation and has only slightly more loading on an internal node therein.

However, unlike prior art dynamic latches, the present invention is able to store a data value indefinitely when the latch will not be clocked for an extended period of time. As previously mentioned, the present invention provides a latch which functions similarly to a clocked feedback latch when there are significant periods of inactivity and the latch is not clocked. Even when the latch disclosed in the present invention is not operating normally in the dynamic state, the latch consumes less power than other clocked feedback latches because an output of the feed-forward portion of the device does not have to drive the feedback device to enable the latch to indefinitely store a data value. Rather, a low power clock signal indicating the latch is operating when no clock is present such as in a low power mode of operation, is provided to drive the feedback device. The low power clock signal is provided for other purposes in a data processing system and, therefore, no significant amount of power is dissipated in providing the signal to the feedback device of the present invention.

Additionally, the present invention operates at advantageous speeds which are only slightly lower than the prior art dynamic latch and faster than a constant feedback static latch. The present invention has very little contention between the feedback device and the feed-forward portion of the latch. Because there is no contention on the internal node of the latch, the present invention may provide a data value more quickly than a prior art constant feedback static latch. The latch of the present invention is only slightly slower than a dynamic latch because of the minimal loading of the feedback device.

The present invention provides a feedback latch which has the advantages of both prior art dynamic and static latches. The present invention provides a device which is able to quickly latch data, store the data indefinitely, and consumes a minimal amount of power by providing a separate clock for the feedback device of the latch.

Figure 4:
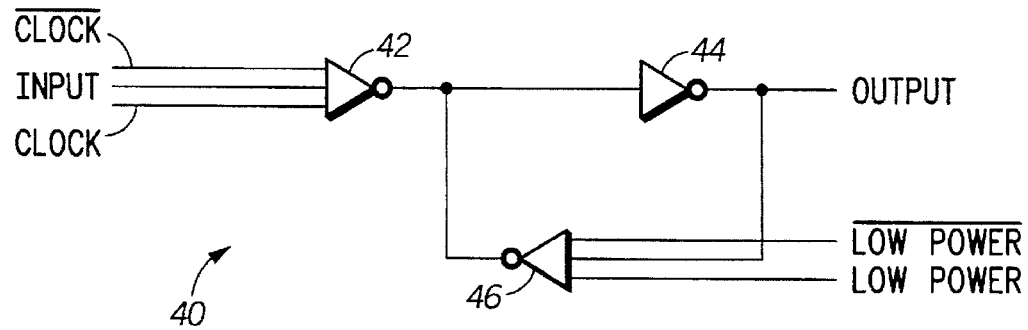
FIG. 4 illustrates in block diagram form a low power latch in accordance with the present invention.

The present embodiment of the invention is illustrated in greater detail in FIG. 4. FIG. 4 provides a feedback latch 40 which is comprised of an inverter 42, an inverter 44, and an inverter 46. Inverter 42 receives a Clock signal at a first input, an Input signal at a second input, and a $\overline{\text{Clock}}$ signal at a third input. An output of inverter 42 is coupled to a first input of inverter 44. An output of inverter 44 is labeled "Output" and is provided to an input of inverter 46. A Low Power signal is provided to a second input of inverter 46 and a complement of the Low Power signal, a $\overline{\text{Low Power}}$ signal, is provided to a third input of inverter 46. An output of inverter 46 is coupled to the input of inverter 44. It should be noted that a feed-forward portion of feedback latch 40 includes inverter 42 and inverter 44. A feedback portion of feedback latch 40 includes inverter 46.

During operation, when the Clock and $\overline{\text{Clock}}$ signals are asserted, inverter 42 provides in inverted Input signal to inverter 44. Inverter 44 subsequently provides the Output signal. When the Clock and $\overline{\text{Clock}}$ signals are not asserted, inverter 42 does not provide the inverted Input signal. Assuming that inverter 46 is not active because the Low Power and $\overline{\text{Low Power}}$ signals are not asserted, inverter 42 and inverter 44 function similarly to a dynamic latch when the Clock and $\overline{\text{Clock}}$ signals are regularly asserted. The Clock and $\overline{\text{Clock}}$ signals are not asserted concurrently with the Low Power and $\overline{\text{Low Power}}$ signals.

However, when the Clock and $\overline{\text{Clock}}$ signals are not provided regularly, feedback latch 40 must enable inverter 46 to function as a feedback device such that the data value indicated by the Input signal is not modified during the latching function. Inverter 46 is enabled to perform a feedback function when the Low Power and $\overline{\text{Low Power}}$ signals are provided thereto. When enabled, inverter 46 inverts the Output signal and provides it as an input to inverter 44 to provide the feedback function.

The Low Power and $\overline{\text{Low Power}}$ signals are provided when there are long periods of inactivity. These long periods of inactivity are detected by a power management circuit which selectively determines when portions of a data processor are turned off to conserve power consumption. Power management circuits are well known in the data processing art and will not be discussed in further detail.

Furthermore, it should be noted that inverter 46 can be of minimal size because it is an active device which uses the Low Power and $\overline{\text{Low Power}}$ signals. The presence of both the Clock and Low Power signals for independently clocking the feed-forward and feedback portions of latch 40, respectively, reduces the loading on the Clock signal and allows the size of clock drivers (not shown herein) to be reduced such that less loading is produced on the Clock signal throughout an entire data processing system in which the Clock signal is used. With less loading on the Clock signal, it will be easier to support faster edge rates on both the Clock and Low Power signals such that faster operation is possible.

Figure 5:
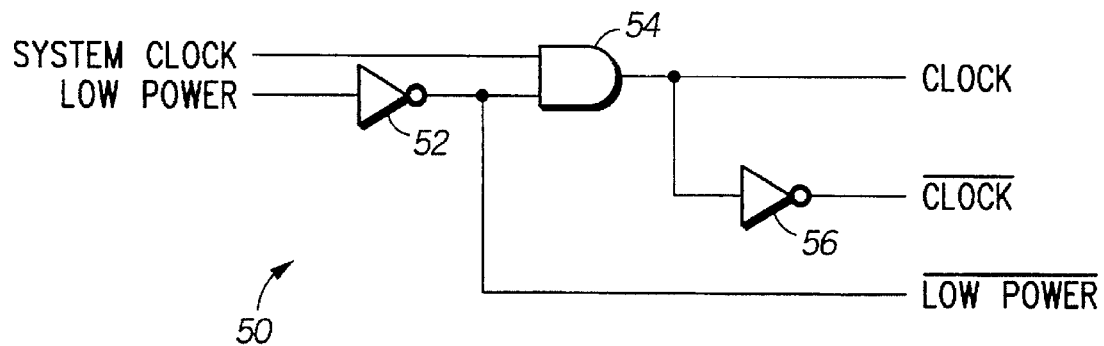
FIG. 5 illustrates in block diagram form a circuit for generating a plurality of input signals to the low power latch of FIG. 4.

FIG. 5 provides one embodiment of a generation circuit 50 which generates the input signals provided to latch 40 during a latching operation. Generation circuit 50 includes an inverter 52, an AND gate 54, and an inverter 56. A System Clock signal is provided to a first input of AND gate 54. The System Clock signal is a clock signal which may be provided by an external crystal oscillator or some other source which is well known in the data processing art. As well, the Low Power signal is generated by a power management circuit (not illustrated herein). The power management circuit controls generation of clocks to portions of a data processing system for an idle or sleep mode of operation. The Low Power signal is provided to an input of inverter 52. An output of inverter 52 provides the Low Power signal and is coupled to a second input of AND gate 54. An output of AND gate 54 is the Clock signal. The output of AND gate 54 is coupled to an input of inverter 56. An output of inverter 54 is the Clock signal.

During operation, AND gate 54 "ands" the System Clock signal and the Low Power signals together such that the Clock signal is only provided when the System Clock signal is asserted and the Low Power signal is negated. Therefore, the System Clock signal and the Low Power signal are mutually exclusive and never provide clocking signals concurrently.

Figure 6:
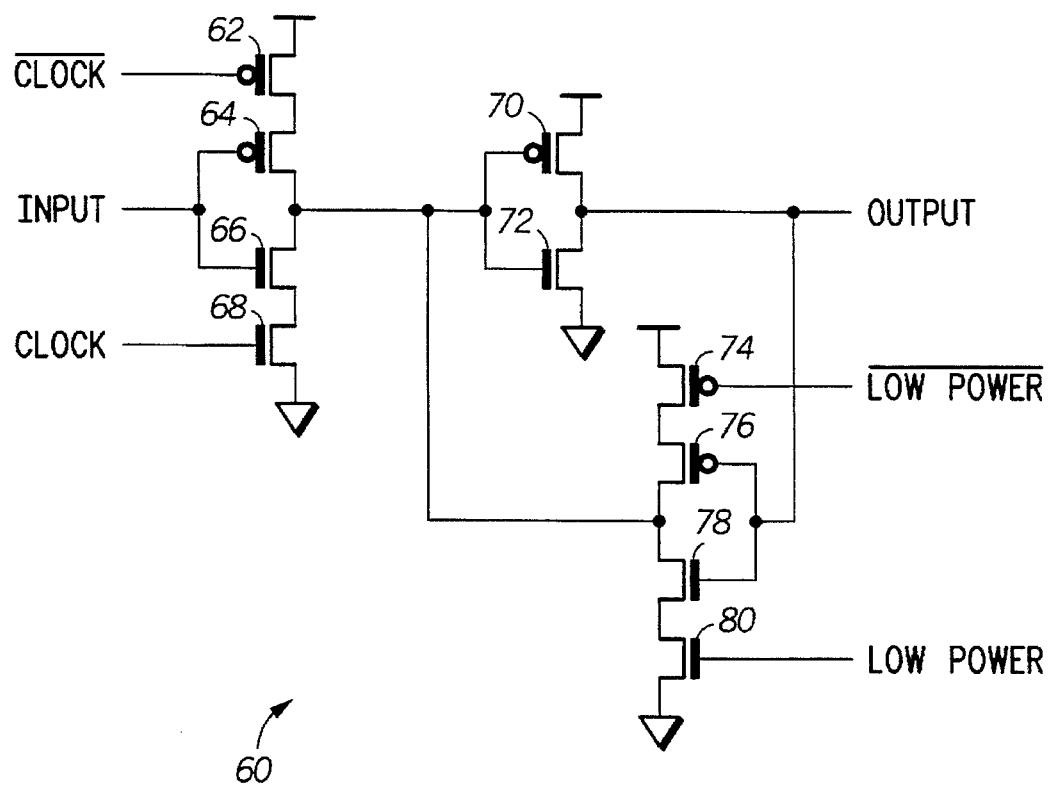
FIG. 6 illustrates in circuit diagram form the low power latch of FIG. 4.

FIG. 6 illustrates a circuit diagram of the present invention. FIG. 6 illustrates a transistor 60 which includes a plurality of transistors 62 through 80. The Clock signal is provided to an inverted control electrode of a transistor 62. A first terminal of transistor 62 is coupled to a power voltage. The Input signal is provided to an inverted control electrode of a transistor 64 and a control electrode of a transistor 66. A first terminal of transistor 64 is coupled to a second terminal of transistor 62. A second terminal of transistor 64 is coupled to a first terminal of transistor 66. The Clock signal is provided to a control electrode of a transistor 68. A first terminal of transistor 68 is coupled to a second terminal of transistor 66 and a second terminal of transistor 68 is coupled to a reference ground voltage.

A second terminal of transistor 64 is coupled to an inverted control electrode of a transistor 70 and a control electrode of a transistor 72. A first terminal of transistor 70 is coupled to the power voltage and a second terminal of transistor 70 provides the Output signal. A first terminal of transistor 72 is coupled to the second terminal of transistor 70 and the second terminal of transistor 72 is coupled to the reference ground voltage.

The first terminal of transistor 72 is also coupled to an inverted control electrode of a transistor 76 and a control electrode of a transistor 78. A first terminal of transistor 76 is coupled to a first terminal of a transistor 74. A control electrode of transistor 74 is coupled to the Low Power signal and a second terminal of transistor 74 is coupled to the power voltage. A second terminal of transistor is coupled to the second terminal of transistor 64 and a first terminal of transistor 78. A second terminal of transistor 78 is coupled to a first terminal of a transistor 80. A control electrode of transistor 80 is coupled to the Low Power signal and a second terminal of transistor 80 is coupled to the reference ground voltage.

During operation of latch 60, the Clock and Clock signal selectively enable transistors 62, 64, 66, and 68 to invert the Input signal and provide it to an inverter formed by transistors 70 and 72. Transistors 70 and 72 complement an inverted Input signal to generate the Output signal. The Low Power and Low Power signals selective enable transistors 74, 76, 78, and 80 to invert the Output signal and provide it to the inverter formed by transistors 70 and 72.

The present invention provides a feedback latch which has the advantages of both prior art dynamic and static latches; the present invention provides a device which is able to quickly latch data, store the data indefinitely, and consume a minimal amount of power by providing a separate clock for the feedback device of the latch. By selectively decoupling the feedback portion from a feed-forward portion of the latch, power is saved and the speed of latching data may be increased. In an industry in which power consumption is becoming an increasingly critical parameter, the power savings provided by the present invention indicate a significant and important addition to technology.

The implementation of the invention described herein is provided by way of example only. However, many other implementations may exist for executing the function described herein. For example, the present invention may be implemented using all types of technologies including CMOS and bipolar. Additionally, two or more of the latches disclosed herein may be used as building blocks for other devices. An example of such a device would be a flip-flop. As well, the inverters used in the present invention may be replaced by CMOS pass gates, n-type pass gates, or p-type pass gates. A multiplexer latch with multiple inputs and multiple gated clocks may also be used in lieu of the inverters described in the present embodiment of the invention. Similarly, scan latches and Earle latches may also be used in the present invention.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A latch comprising:

a generation circuit having a first input terminal for receiving a periodic clock signal, a second input terminal for receiving a low power signal, and an output terminal for providing a gated clock signal, said generation circuit providing said periodic clock signal to said output terminal thereof if said low power signal is in a first logic state, said generation circuit providing said gated clock signal at a predetermined logic state if said low power signal is in a second logic state;

a first gated inverter having a data input terminal for receiving an input signal of the latch, a control input terminal coupled to said output terminal of said generation circuit, and an output terminal;

a second inverter having an input terminal coupled to said output terminal of said first gated inverter, and an output terminal for providing an output signal of the latch; and a third gated inverter having a data input terminal coupled to said output terminal of said second inverter, a control input terminal for receiving said low power signal, and an output terminal coupled to said input terminal of said second inverter, wherein when said low power signal is in said first logic state, said third gated inverter provides an output signal to said output terminal thereof to be a complement of an input signal at said data input terminal thereof, and when said low power signal is in said second logic state, said third gated inverter provides said output signal in a high impedance state;

wherein when said low power signal is in said first logic state, said latch functions as a dynamic latch, and when said low power signal is in said second logic state, said latch functions as a static latch.

2. The latch of claim 1 wherein said first gated inverter comprises:

a first transistor of a first conductivity type having a first current electrode coupled to a first power supply voltage terminal, a control electrode for receiving a complement of said gated clock signal, and a second current electrode;

a second transistor of said first conductivity type having a first current electrode coupled to said second current electrode of said first transistor, a control electrode for receiving said input signal of the latch, and a second current electrode;

a third transistor of a second conductivity type having a first current electrode coupled to said second current electrode of said second transistor, a control electrode for receiving said input signal of the latch, and a second current electrode; and a fourth transistor of said second conductivity type having a first current electrode coupled to said second current electrode of said third transistor, a control electrode for receiving said gated clock signal, and a second current electrode coupled to a second power supply voltage terminal.

3. The latch of claim 2 wherein said first conductivity type is P-channel and said second conductivity type is N-channel.

4. The latch of claim 2 wherein said generation circuit comprises:

a first inverter having an input terminal for receiving said low power signal, and an output terminal for providing said complement of said low power signal;

an AND gate having a first input terminal for receiving said periodic dock signal, a second input terminal coupled to said output terminal of said first inverter, and an output terminal for providing said gated clock signal; and a second inverter having an input terminal coupled to said output terminal of said AND gate, and an output terminal for providing said complement of said gated clock signal.

5. The latch of claim 1 wherein said third gated inverter comprises:

a first transistor of a first conductivity type having a first current electrode coupled to a first power supply voltage terminal, a control electrode for receiving a complement of said low power signal, and a second current electrode;

a second transistor of said first conductivity type having a first current electrode coupled to said second current electrode of said first transistor, a control electrode coupled to said output terminal of said second inverter, and a second current electrode;

a third transistor of a second conductivity type having a first current electrode coupled to said second current electrode of said second transistor, a control electrode coupled to said output terminal of said second inverter, and a second current electrode; and a fourth transistor of said second conductivity type having a first current electrode coupled to said second current electrode of said third transistor, a control electrode for receiving said low power signal, and a second current electrode coupled to a second power supply voltage terminal.

6. The latch of claim 5 wherein said first conductivity type is P-channel and said second conductivity type is N-channel.

7. The latch of claim 5 wherein said generation circuit comprises:

a first inverter having an input terminal for receiving said low power signal, and an output terminal for providing said complement of said low power signal; and an AND gate having a first input terminal for receiving said periodic clock signal, a second input terminal coupled to said output terminal of said first inverter, and an output terminal for providing said gated clock signal.

8. In a latch comprising a first gated inverter having a data input terminal for receiving an input signal, a control input terminal, and an output terminal, a second inverter having an input terminal coupled to said output terminal of said first gated inverter, and an output terminal for providing an output signal of the latch, and a third gated inverter having a data input terminal coupled to said output terminal of said second inverter, a control input terminal, and an output terminal coupled to said input terminal of said second inverter, the improvement wherein the latch further comprises:

a generation circuit having a first input terminal for receiving a periodic clock signal, a second input terminal for receiving a low power signal, and an output terminal, coupled to said control input terminal of said first gated inverter, for providing a gated clock signal, said generation circuit providing said periodic clock signal to said output terminal thereof if said low power signal is in a first logic state, said generation circuit providing said gated clock signal at a predetermined logic state if said low power signal is in a second logic state; and wherein said third gated inverter further receives said low power signal at said control input terminal thereof, wherein when said low power signal is in said first logic state, said third gated inverter provides an output signal to said output terminal thereof to be a complement of an input signal at said data input terminal thereof, and when said low power signal is in said second logic state, said third gated inverter provides said output signal in a high impedance state.

9. The latch of claim 8 wherein said first gated inverter comprises:

a first transistor of a first conductivity type having a first current electrode coupled to a first power supply voltage terminal, a control electrode for receiving a complement of said gated clock signal, and a second current electrode;

a second transistor of said first conductivity type having a first current electrode coupled to said second current electrode of said first transistor, a control electrode for receiving said input signal, and a second current electrode;

a third transistor of a second conductivity type having a first current electrode coupled to said second current electrode of said second transistor, a control electrode for receiving said input signal, and a second current electrode; and a fourth transistor of said second conductivity type having a first current electrode coupled to said second current electrode of said third transistor, a control electrode for receiving said gated clock signal, and a second current electrode coupled to a second power supply voltage terminal.

10. The latch of claim 9 wherein said first conductivity type is P-channel and said second conductivity type is N-channel.

11. The latch of claim 9 wherein said generation circuit comprises:

a first inverter having an input terminal for receiving said low power signal, and an output terminal for providing said complement of said low power signal;

an AND gate having a first input terminal for receiving said periodic clock signal, a second input terminal coupled to said output terminal of said first inverter, and an output terminal for providing said gated clock signal; and a second inverter having an input terminal coupled to said output terminal of said AND gate, and an output terminal for providing said complement of said gated clock signal.

12. The latch of claim 8 wherein said third gated inverter comprises:

a first transistor of a first conductivity type having a first current electrode coupled to a first power supply voltage terminal, a control electrode for receiving a complement of said low power signal, and a second current electrode;

a second transistor of said first conductivity type having a first current electrode coupled to said second current electrode of said first transistor, a control electrode coupled to said output terminal of said second inverter, and a second current electrode;

a third transistor of a second conductivity type having a first current electrode coupled to said second current electrode of said second transistor, a control electrode coupled to said output terminal of said second inverter, and a second current electrode; and a fourth transistor of said second conductivity type having a first current electrode coupled to said second current electrode of said third transistor, a control electrode for receiving said low power signal, and a second current electrode coupled to a second power supply voltage terminal.

13. The latch of claim 12 wherein said first conductivity type is P-channel and said second conductivity type is N-channel.

14. The latch of claim 12 wherein said generation circuit comprises:

a first inverter having an input terminal for receiving said low power signal, and an output terminal for providing said complement of said low power signal; and an AND gate having a first input terminal for receiving said periodic clock signal, a second input terminal coupled to said output terminal of said first inverter, and an output terminal for providing said gated clock signal.

15. A method for operating a latch, the latch comprising a first gated inverter having an input terminal for receiving an input signal of the latch and an output terminal, a second inverter having an input terminal coupled to the output terminal of the first gated inverter, and an output terminal for providing an output of the latch, and a third gated inverter having a data input terminal coupled to the output terminal of the second inverter, and an output terminal coupled to the input terminal of the second inverter, comprising the steps of:

clocking the first gated inverter with a periodic clock input signal in a normal operation mode;

disabling the third gated inverter in said normal operation mode;

disabling the first gated inverter in a low power mode; and enabling the third gated inverter in response to entering said low power mode, wherein the latch functions as a dynamic latch using the first gated inverter and the second inverter in the normal operation mode, and as a static latch using the second inverter and the third gated inverter in the low power mode.

\* \* \* \* \*

UNITED STATES PATENT AND TRADEMARK OFFICE
CERTIFICATE OF CORRECTION

PATENT NO.     :     5,629,643

DATED          :     May 13, 1997

INVENTOR(S)    :     Claude Moughanni et al.

It is certified that error appears in the above-identified patent and that said Letters Patent is hereby corrected as shown below:

Claim 4, column 7, line 42, replace "dock" with --clock--.

Signed and Sealed this

Eleventh Day of April, 2000

Attest:

Attesting Officer

Q. TODD DICKINSON

Director of Patents and Trademarks